(12) United States Patent
Nakayama

(10) Patent No.: US 7,514,877 B2
(45) Date of Patent: Apr. 7, 2009

(54) DISPLAY PANEL DRIVING CIRCUIT

(75) Inventor: Akira Nakayama, Ibaraki (JP)

(73) Assignee: Oki Semiconductor Co., Ltd. (JP)

( * ) Notice: Subject to any disclaimer, the term of this patent is extended or adjusted under 35 U.S.C. 154(b) by 98 days.

(21) Appl. No.: 11/802,092

(22) Filed: May 18, 2007

(65) Prior Publication Data
US 2007/0296352 A1 Dec. 27, 2007

(30) Foreign Application Priority Data
Jun. 21, 2006 (JP) .............................. 2006-171625

(51) Int. Cl.
G09G 3/10 (2006.01)
G09G 3/36 (2006.01)
G05F 1/00 (2006.01)
G01R 19/00 (2006.01)

(52) U.S. Cl. ..................... 315/169.3; 315/291; 315/294; 345/87; 345/102; 345/103; 345/104; 327/51; 327/52; 327/53

(58) Field of Classification Search ............... 315/169.3, 315/291, 294; 345/87, 102–104
See application file for complete search history.

(56) References Cited

FOREIGN PATENT DOCUMENTS

JP   2005-192260   7/2005

*Primary Examiner*—Douglas W Owens
*Assistant Examiner*—Jianzi Chen
(74) *Attorney, Agent, or Firm*—Studebaker & Brackett PC; Donald R. Studebaker

(57) ABSTRACT

A display panel driving circuit includes an input part for amplifying an input on-off signal so as to generate a first on-off voltage signal, a voltage signal generation part for generating a second on-off voltage signal which is varied in response to variations of the first on-off voltage signal, and an output part generating a push-pull output voltage as a driving voltage so as to drive a display panel in response to the first and second on-off voltages. The display panel driving circuit further includes a controlling part for controlling the voltage signal generation part so that a difference between on and off voltages of the second on-off voltage signal is not smaller than a predetermined voltage. Therefore, the push-pull output voltage whose response speed is well balanced when the push-pull output voltage increases and decreases can be generated without increasing electric power consumption and a circuit area.

5 Claims, 3 Drawing Sheets

DISPLAY PANEL DRIVING CIRCUIT

BACKGROUND OF THE INVENTION

1. Field of the Invention

The present invention relates to a display panel driving circuit for driving a display panel, and in particular relates to a display panel driving circuit having an output part generating a push-pull output as a driving output for driving a display panel.

2. Description of the Related Art

A conventional display panel driving circuit is disclosed in, for example, Japanese Patent Application Laid-Open Publication No. 2005-192260.

FIG. 1 is a schematic circuit diagram showing a display panel driving circuit related to a display panel driving circuit according to the present invention. The display panel driving circuit of FIG. 1 is configured by a differential input part 10, a voltage signal generation part 20, and an output part 30.

The differential input part 10 includes p-channel metal oxide semiconductor (PMOS) transistors 11 and 12 having gate terminals to which an input inversion voltage VIN− and an input non-inversion voltage VIN+ are supplied respectively. Source terminals of the PMOS transistors 11 and 12 are connected to a node N11. The node N11 is connected to a positive power-supply voltage VDD via a PMOS transistor 13 having a gate terminal to which a bias voltage VP is supplied. The PMOS transistor 13 configures a constant-current circuit which provides a substantially constant electric current to the PMOS transistors 11 and 12.

Drain terminals of PMOS transistors 11 and 12 are connected to nodes N12 and N13, respectively. These nodes N12 and N13 are connected to a negative power-supply voltage VSS via N-channel metal oxide semiconductor (NMOS) transistors 14 and 15, respectively. Gate terminals of NMOS transistors 14 and 15 are connected to the node N12.

The voltage signal generation part 20 includes an NMOS transistor 21 having a gate terminal to which a voltage on the node N13 is applied. The NMOS transistor 21 has a drain terminal connected to a node N21 and a source terminal connected to the power-supply voltage VSS. The node N21 is connected to the power-supply voltage VSS via an NMOS transistor 22, and connected to the power-supply voltage VDD via a PMOS transistor 23. Gate terminals of the NMOS transistor 22 and 24 are connected to the node N21.

The NMOS transistor 24 has a source terminal connected to the power-supply voltage VSS and a drain terminal connected to a node N22. The node N22 is connected to the power-supply voltage VDD via a PMOS transistor 25, and connected to the node N12 via a phase compensation capacitor 26. The bias voltage VP is supplied to gate terminals of the PMOS transistors 23 and 25. The PMOS transistors 23 and 25 respectively configure constant-current circuits which flow respective electric currents to the NMOS transistor 22 and 24.

The output part 30 includes an NMOS transistor 31 having a gate terminal connected to the node N13, a source terminal connected to the power-supply voltage VSS, and a drain terminal connected to a node N31. The node N31 is connected to the power-supply voltage VDD via a PMOS transistor 32, and a gate terminal of the PMOS transistor 32 is connected to the node N22. The node N31 is connected to the node N13 via a phase compensation capacitor 33. An output voltage VOUT is supplied from the node N31 to an external load CL connected between the node N31 and the power-supply voltage VSS.

Operations of the circuit will now be described. The PMOS transistor 13 and the PMOS transistors 23, 25 configure constant-current circuits, respectively. An electric current flowing from the PMOS transistor 13 of the differential input part 10 is defined as i1. Electric currents flowing from the PMOS transistors 23 and 25 of the voltage signal generation part 20 are defined as i2 and i3, respectively.

A voltage state in which the input non-inversion voltage VIN+ is substantially same as the input inversion voltage VIN− is defined as a stationary state. In the stationary state, respective electric currents flowing from the PMOS transistors 11 and 12 of the differential input parts 10 are given by i1/2. Electric currents flowing from the NMOS transistors 21, 22, and 24 of the voltage signal generation part 20 are given by i2/a, i2/β, and i3, respectively, where a and β are any values at which the display panel driving circuit appropriately can operate and an equation given by $(1/a)+(1/\beta)=1$ is fulfilled. It is usually configured that i2 is equal to or larger than i3.

In response to a change from the stationary state to a voltage state in which the input non-inversion voltage VIN+ is higher than the input inversion voltage VIN−, in the differential input part 10, an electric current flowing from the PMOS transistor 11 increases, whereas an electric current flowing from the PMOS transistor 12 decreases. A voltage applied on the node N12 increases, whereas a voltage applied on the node N13 decreases. The voltage on the node N13 applied to the gate terminal of NMOS transistor 31 of the output part 30 decreases, thus decreasing an electric current (an electric current flowing from the external load CL to the node N31) flowing from the NMOS transistor 31.

At this time, in the voltage signal generation part 20, the voltage on the node N13 of the differential input part 10, which is also applied to the gate terminal of the NMOS transistor 21, decreases, thus decreasing an electric current flowing in the NMOS transistor 21. An electric current flowing to the NMOS transistor 22 increases, thus increasing a voltage on the node N21. An electric current flowing to the NMOS transistor 24 increases, thus decreasing a voltage on the node N22. Therefore, a charging current flowing from the PMOS transistor 32 of the output part 30 to the external load CL increases. In the voltage state in which VIN+ is higher than VIN−, the output voltage VOUT increases.

In response to a change from the stationary state to a voltage state in which the input non-inversion voltage VIN+ is lower than the input inversion voltage VIN−, on the other hands, in differential input part 10, the electric current flowing to the PMOS transistor 11 decreases, whereas the electric current of the PMOS transistor 12 increases. The voltage of the node N12 decreases, whereas the voltage on node N13 increases. The voltage increase on the node N13 turns off the NMOS transistor 31, thus increasing the electric current flowing from the external load CL to the NMOS transistor 31 of the output part via the node N31. The output voltage VOUT decreases in the voltage state in which VIN+ is lower than VIN−.

At this time, in the voltage signal generation part 20, the voltage increase on the node N13 turns on the NMOS transistor 21, thus increasing the electric current flowing to the NMOS transistor 21 and decreasing the electric current flowing from the NMOS transistor 22. The voltage of node N21 decreases. Since the electric current flowing to the NMOS transistor 24 also decreases, the voltage on the node N22 increases. A charging current supplied from the PMOS transistor 32 of the output part 30 to the external load CL decreases. In the voltage state in which VIN+ is lower than VIN−, the output voltage VOUT decreases.

Thus, the output voltage VOUT corresponding to a difference in voltage between the input non-inversion voltage VIN+ and the input inversion voltage VIN− is supplied to the external load CL.

However, there is the following difficulty in the display panel driving circuit of FIG. 1. The output part 30 is configured by the NMOS transistor 31 and the PMON transistor 32 which are push-pull connected to each other. The NMOS transistor 31, which is one of the push-pull connection, is directly controlled by an output signal of the differential input part 10 (the voltage on the node N13), and the PMON transistor 32, which is the other of the push-pull connection, is controlled by an output signal of the voltage signal generation part 20 (the voltage on the node N22).

In response to the change from the stationary state into the voltage state where the input inversion voltage VIN− is lower than the input non-inversion voltage VIN+, the voltage increase on the node N13 immediately drives the NMOS transistor 31 of the output part 30, thus immediately decreasing the output voltage VOUT. In response to the change from the stationary state into the voltage state where the input inversion voltage VIN− is lower than the input non-inversion voltage VIN+, on the other hand, the voltage decrease of the node N13 decreases the voltage on the node N22 of the voltage signal generation part 20 and drives the PMOS transistor 32 of the output part 30, thus increasing the output voltage VOUT. The display panel driving circuit generates the output voltage VOUT at different response speeds when the output voltage VOUT increases and decreases. The response speed when the output voltage VOUT increases is slower than that when the output voltage VOUT decreases, which causes distortion in waveform of the output signal and timing errors.

Typical solutions improves the problems by increasing the electric current of constant-current circuits configured by the PMOS transistors 13, 23, and 25 and by increasing a gm (a coefficient of mutual induction) of the PMOS transistor 32 of the output part 30. However, the solutions increase electric current consumption and a circuit area.

It is an object of the present invention to provide a display panel driving circuit having output part for generating a push-pull output as a driving output for driving a display panel and generating the push-pull output whose response speed is well balanced when the push-pull output increases and decreases without increase electric current consumption and a circuit area thereof.

SUMMARY OF THE INVENTION

According to a first aspect of the present invention, there is provided a display panel driving circuit which comprises an input part for amplifying an input on-off signal so as to generate a first on-off voltage signal, a voltage signal generation part for generating a second on-off voltage signal which is varied in response to variations of the first on-off voltage signal, and an output part including a first output transistor having a first conductive type and a second output transistor having a second conductive type. The first and second output transistors are push-pull connected for generating a push-pull output voltage as a driving voltage so as to drive a display panel. Conductivities of the first output transistor and the second output transistor are controlled by the first on-off voltage signal and the second on-off voltage signal, respectively. The display panel driving circuit further comprises a controlling part for controlling the voltage signal generation part so that a difference between on and off voltages of the second on-off voltage signal is not smaller than a predetermined voltage.

The display panel driving circuit includes the controlling part for controlling the voltage signal generation part so that a difference between on and off voltages of the second on-off voltage signal is not smaller than a predetermined voltage. Thus, the first output transistor operates at substantially the same speed as the second output transistor, whereby to generate the well balanced push-pull output voltage when the push-pull output voltage increases and decreases.

DETAILED DESCRIPTION OF THE INVENTION

In the first and second embodiments, the input part of the display panel driving circuit according to the present invention is configured as a differential amplification circuit which generates a voltage corresponding to a difference in amplitudes between two input signals. The controlling part is configured as an electric current adding part for adding an electric current to one of two electric current paths, thus increasing a difference in electric potentials between the two electric current paths.

First Embodiment

Figure 1:
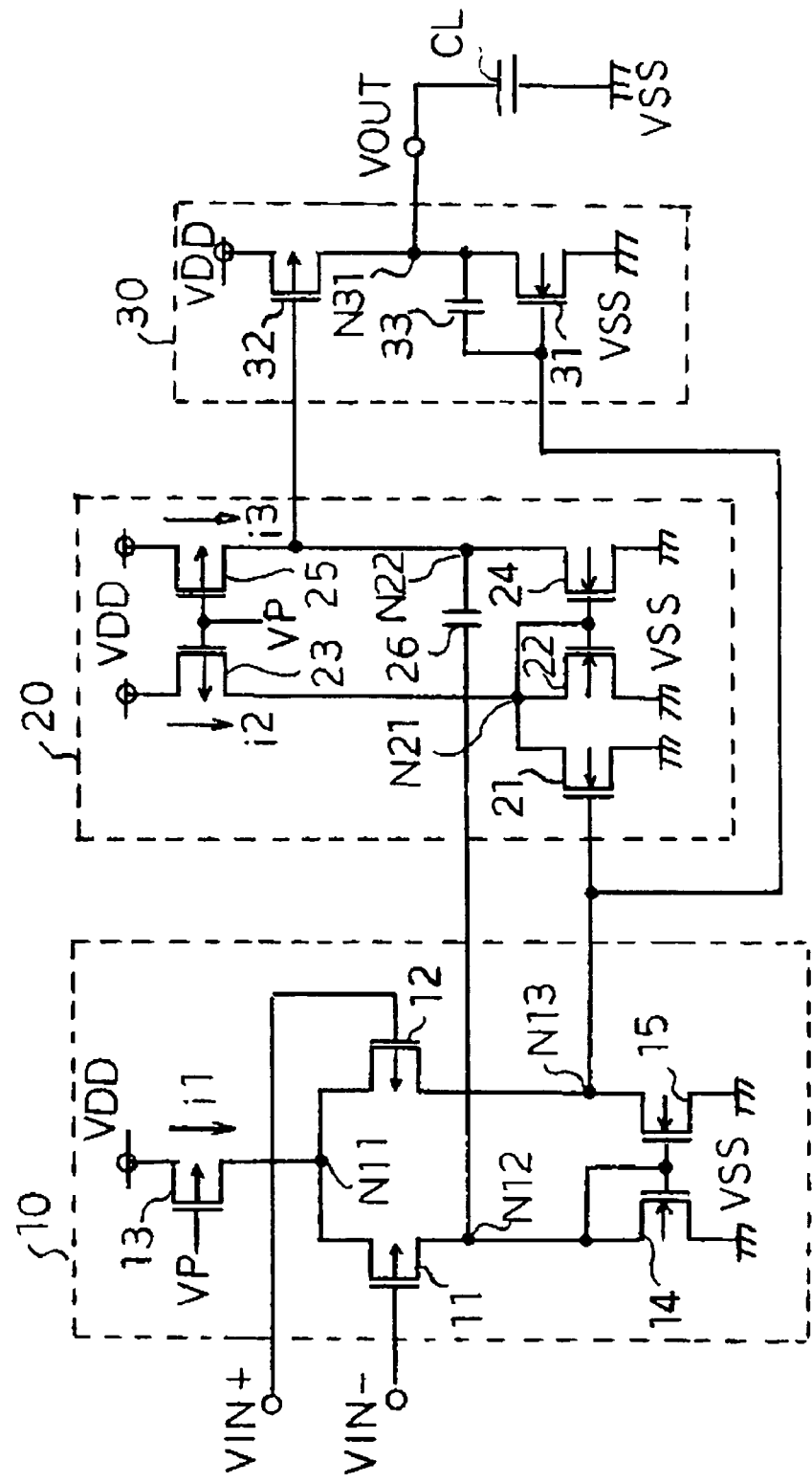
FIG. 1 is a schematic circuit diagram showing a related display panel driving circuit.
Figure 2:
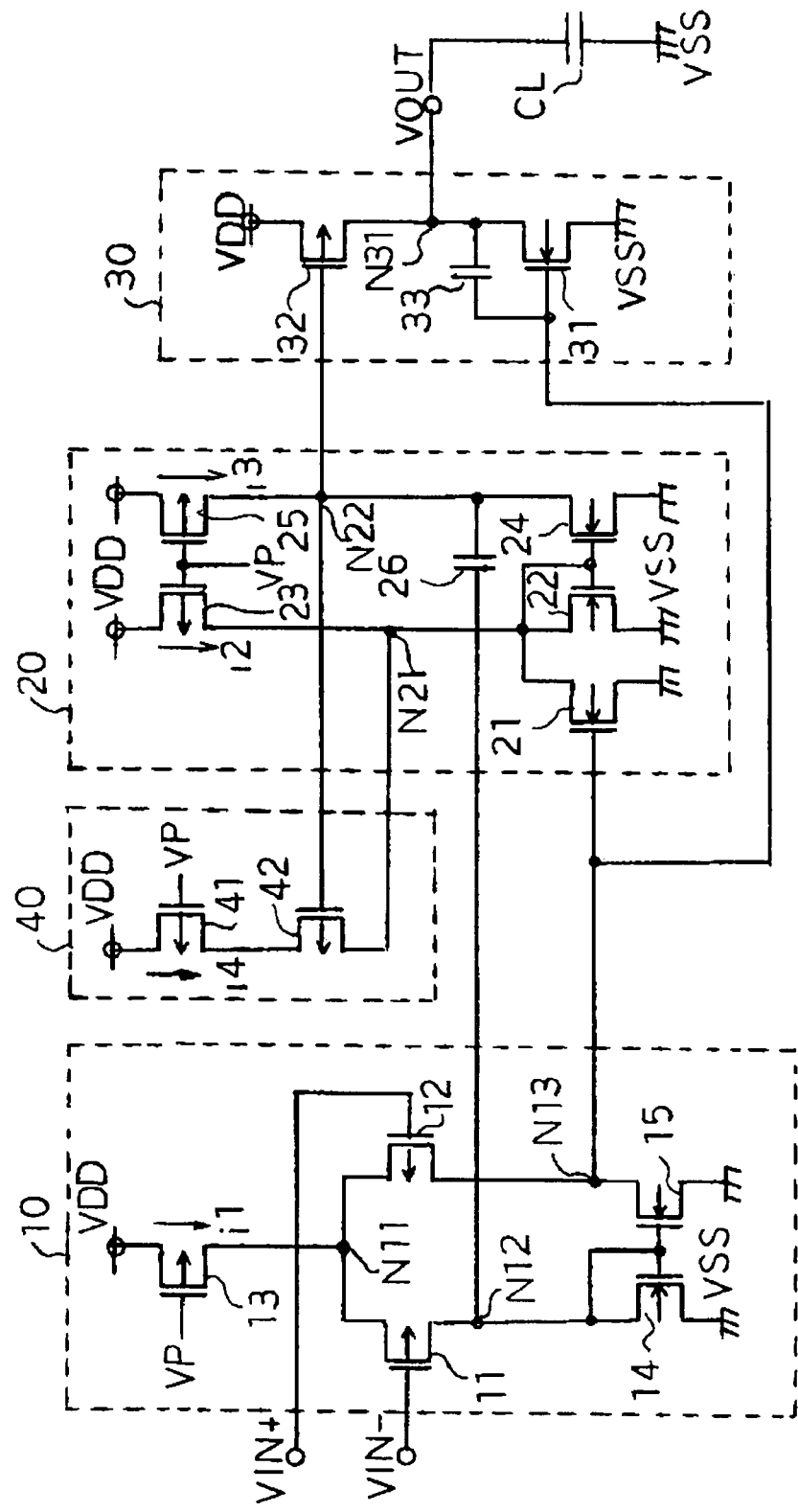
FIG. 2 is a schematic circuit diagram showing a first embodiment of the display panel driving circuit according to the present invention.

The first embodiment of the display panel driving circuit according to the present invention will now be described with reference to FIG. 2. FIG. 2 is a schematic circuit diagram showing the first embodiment of the display panel driving circuit according to the present invention. Elements which operate in the same manner are denoted by the same numerals of those of FIG. 1.

The display panel driving circuit includes a differential input part 10, a voltage signal generation part 20, and an output part 30, and in addition, includes an electric current adding part 40 connected across a node N21 of the voltage signal generation part 20 and a power-supply voltage VDD the voltage signal generation part 20. The electric current adding part 40 functions as a level sensor.

The differential input part 10 generates a voltage corresponding to a difference between an input inversion voltage VIN− and an input non-inversion voltage VIN+. The differential input part 10 has PMOS transistors 11 and 12 having gate terminals to which the input inversion voltage VIN− and the input non-inversion voltage VIN+ are supplied, respectively. The PMOS transistors 11 and 12 have source terminals connected to a node N11. The node N11 is connected to the positive power-supply voltage VDD via a PMOS transistor 13 having a gate electrode to which a bias voltage VP is supplied. The PMOS transistor 13 configures a constant-current circuit which generates a substantially constant electric current.

The PMOS transistors 11 and 12 have drain terminals connected to nodes N12 and N13, respectively. These nodes N12 and N13 are connected to a negative power-supply voltage VSS via NMOS transistors 14 and 15, respectively. The NMOS transistors 14 and 15 having gate terminals connected to the node N12 configure a current mirror circuit which pulls an electric current flowing to the NMOS transistor 14 from the NMOS transistor 15.

The voltage signal generation part 20 supplies an output signal to the output part 30. The output signal of the voltage signal generation part is varied in its amplitude in response to variations of the output signal supplied from differential input part 10. The voltage signal generation part 20 has an NMOS transistor 21 having a gate terminal to which a voltage on the node N13 is applied. The NMOS transistor 21 has a drain terminal connected to the node N21 and a source terminal connected to the power-supply voltage VSS. The node N21 is connected to the power-supply voltage VSS via an NMOS transistor 22, and connected to the power-supply voltage VDD via a PMOS transistor 23. Gate terminals of the NMOS transistors 22, 24 are connected to the node 21. The NMOS transistors 22 and 24 configure a current mirror circuit which pulls an electric current flowing to the NMOS transistor 14 from the NMOS transistor 15.

The NMOS transistor 24 has a source terminal connected to the power-supply voltage VSS and a drain terminal connected to a node N22. The node N22 is connected to the power-supply voltage VDD via a PMOS transistor 25. The node N22 is connected to the node N12 via a phase compensation capacitor 26. The bias voltage VP is supplied to gate terminals of the PMOS transistors 23 and 25 which respectively configure constant-current circuits generating substantially constant electric current.

The voltage signal generation part 20 includes first and second electric current paths which are connected across the current mirror circuit configured by the NMOS transistors 22, 24 and the PMOS transistors 23 and 25, respectively.

The output part 30, which is a push-pull driving circuit, drives an external load CL in responds to the output signals supplied from the differential input part 10 and the voltage signal generation part 20. The output part 30 includes an NMOS transistor 31 having a gate terminal connected to the node N13, a source terminal connected to the power-supply voltage VSS, and a drain terminal connected to a node N31. The node N31 is connected to the power-supply voltage VDD via a PMOS transistor 32, and a gate terminal of the PMOS transistor 32 is connected to the node N22 of the voltage signal generation part 20. A node N31 is connected to the node N13 of the differential input part 10 via a phase compensation capacitor 33. An output voltage VOUT is applied from the node N31 to the external load CL connected between the node N31 and the power-supply voltage VSS.

The electric current adding part 40 adds an electric current to the first electric current path of the voltage signal generation part 20 when a voltage on the node N22 is lower than that in a stationary state. The stationary state means a voltage state in which the input non-inversion voltage VIN+ is substantially same as the input inversion voltage VIN−. The electric current adding part 40 increases a gain of output signal of the voltage signal generation part 20. The electric current adding part 40 has PMOS transistors 41 and 42 connected in series across the power-supply voltage VDD and the node N21 of the voltage signal generation part 20. The PMOS transistor 41 configuring a constant-current circuit has a gate terminal to which the bias voltage VP is supplied. The PMOS transistor 42 has a gate terminal connected to the node N22.

Operations of the first embodiment of the display panel driving circuit according to the present invention will now be described. An electric current flowing from the PMOS transistor 13, which configures the constant-current circuit of the differential input part 10, is given by i1. Electric currents flowing from the PMOS transistors 23 and 25, which configure the constant-current circuits of the voltage signal generation part 20, are given by i2 and i3, respectively. An electric current flowing from the PMOS transistor 41, which configures the constant-current circuit of the electric current adding part 40, is given by i4.

A voltage state in which the input non-inversion voltage VIN+ is substantially same as the input inversion voltage VIN− is defined as a stationary state. In the stationary state, electric currents respectively flowing to the PMOS transistors 11 and 12 of the differential input parts 10 are given by i1/2. Electric currents respectively flowing to the NMOS transistors 21, 22, and 24 of the voltage signal generation part 20 are given by $(i2+i4s)/a$, $(i2+i4s)/\beta$, and i3, respectively, where a and $\beta$ have any values at which the display panel driving circuit appropriately can operate and an equation given by $(1/a)+(1/\beta) =1$ is substantially fulfilled. It is also configured that i2 is equal to or higher than i3. An electric current flowing to the PMOS transistor 42 of the electric current adding part 40 is given by i4s. An electric current flowing from the PMOS transistor 42 of the electric current adding part 40 is given by $i4/\gamma$, where $\gamma$ is any value larger than 1.

In response to a change from the stationary state to a voltage state in which the input non-inversion voltage VIN+ is higher than the input inversion voltage VIN−, in differential input part 10, an electric current flowing from the PMOS transistor 11 increases, whereas an electric current flowing from the PMOS transistor 12 decreases. A voltage on the node N13 decreases as a voltage on the node N12 increases. Since the voltage of the node N13 applied to the gate terminal of the NMOS transistor 31 of the output part 30 decreases, the NMOS transistor 31 is turned off. Thus, an electric current flowing from the external load CL to the NMOS transistor 31 via the node N31 decreases.

At this time, the voltage on the node N13 decreases and the NMOS transistor of 21 of the voltage signal generation part 20 is gradually turned off, thus decreasing an electric current flowing to the NMOS transistor 21. On the other hands, an electric current flowing to the NMOS transistor 22 increases, thus decreasing a voltage on the node N21. Since the NMOS transistor 22 and 24 configures a current mirror circuit, an increase of the electric current flowing to the NMOS transistor 22 is accompanied by an increase of an electric current flowing to the NMOS transistor 24. Thus, a voltage on the node N22, which is also applied to the gate terminal of the PMOS transistor, decreases, thus completely turning on the PMOS transistor 42 of the electric current adding part 40 and flowing an electric current to the NMOS transistor 22 via the node N21. An added constant electric current given by i2+i4 flows to the NMOS transistor 22, thus further decreasing the voltage on the node N22. Therefore, a charging current supplied to the external load CL, which produced from the PMOS transistor 32 of the output part 30, further increases, so than the output voltage at a higher gain can be produced in comparison with the circuit of FIG. 1.

In response to a change from the stationary state into a voltage state in which the input inversion voltage VIN− is lower than the input non-inversion voltage VIN+, on the other hand, the electric current flowing from the PMOS transistor 11 of the differential input part 10 decreases, whereas the electric current flowing from the PMOS transistor 12 increases. Thus, the voltage on the node N12 decreases and the voltage on the node N13 increases. The voltage increase of the node N13 gradually turns on the NMOS transistor 31 of the output part, thus increasing the electric current flowing from the external load CL to the NMOS transistor 31 of the output part. Therefore, the output voltage VOUT decreases.

At this time, the voltage on the node N13 increases, thus gradually turning on the NMOS transistor 21 and increasing the electric current flowing to the NMOS transistor 21. On the other hand, the electric current flowing to the NMOS transistor 22 decreases, thus increasing the voltage on the node N21. As decreasing the electric current flowing to the NMOS transistor 22, the electric current flowing to the NMOS transistor 24 also decreases, thus increasing the voltage on the node N22 and gradually turning off the PMOS transistor 32 of the output part 30. Therefore, the charging current supplied from the PMOS transistor 32 of the output part 30 to the external load CL decreases. The voltage increase on the node N22 gradually turns off, thus decreasing the electric current flowing from the electric current adding part 40 to the NMOS transistor 22 of the voltage signal generation part 20.

In the first embodiment of the present invention, the display driving circuit includes the electric current adding part 40 which supplies an additional electric current to the NMOS transistor 22 in response to the voltage on the node N22 connected to the PMOS transistor 32 of the output part 30. When changing from the stationary state into the voltage state in which the input non-inversion voltage VIN+ is higher than the input inversion voltage VIN−, the electric current adding part 40 supplies an additional electric current to the NMOS transistor 22, and the voltage on the node N22 more decreases, thus decreasing a gain of the voltage on the node N22, that is, accelerating the voltage decrease. Only by slightly increasing electric power consumption and circuit area, the first embodiment of the present invention can produce the output voltage VOUT whose response speed is well balanced when the output voltage VOUT increases and decreases.

Second Embodiment

Figure 3:
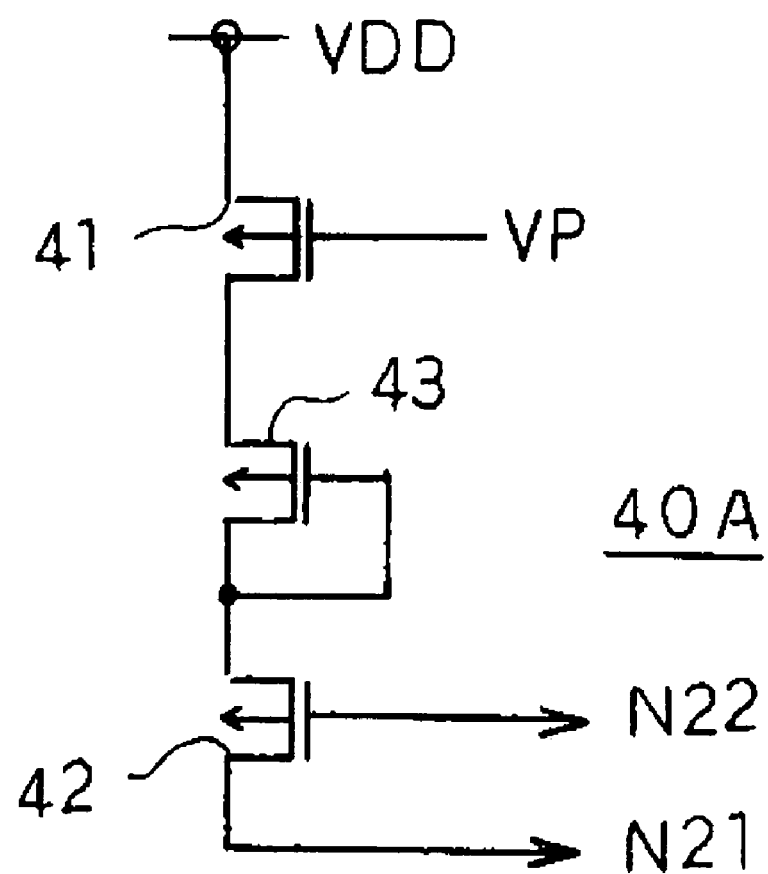
FIG. 3 is a schematic circuit diagram showing a electric adding part of a second embodiment of the display panel driving circuit according to the present invention.

A second embodiment of the display panel driving circuit according to the present invention will now be described with reference to FIG. 3. The second embodiment includes a differential input part 10, a voltage signal generation part 20, and an output part 30, and in addition, includes an electric current adding part 40A similar to the first embodiment. The differential input part 10, the voltage signal generation part 20, and the output part 30, which operate in the same way as those of the first embodiment, are not shown in FIG. 3. FIG. 3 is a schematic circuit diagram showing the electric current adding part 40A of the second embodiment. The electric current adding part 40 A of the second embodiment corresponds to the electric current adding part 40 of the first embodiment. Elements of the electric current adding part 40A operating in the same way are denoted by the same numerals. The electric current adding part 40A has a PMOS transistor 43 which is diode-connected across PMOS transistors 41 and 42. In the same way as the first embodiment of FIG. 2, the PMOS transistor configures a constant-current circuit and the PMOS transistor 42 operates as a switch.

Since a voltage subtracted by a threshold voltage of the PMOS transistor 43 is applied to a source terminal of the PMOS transistor 42 of the electric current adding part 40A, the PMOS 42 is completely tuned off in response to a voltage applied on a node N22 at a stationary state. Thus, an electric current do not flow from the electric current adding part 40A to NMOS transistors 21 and 22 of the voltage signal generation part 20 at the stationary state. In similar to the first embodiment, the second embodiment operates in response to a change from the stationary state to a voltage state in which an input non-inversion voltage VIN+ is higher than an input inversion voltage VIN− and in response to a change from the stationary state to a voltage state in which an input non-inversion voltage VIN+ is lower than an input inversion voltage VIN−. In the stationary state, the electric current adding part 40A do not supply an additional electric current to the voltage signal generation part 20. When the voltage on the node N22 decreases, the electric current adding part 40A supplies the additional electric current to the voltage signal generation part 20. The second embodiment effectively operates in the same way as the first embodiment and further has an effect that the electric current adding part 40A do not supply the additional electric current to the voltage signal generation part 20 in the stationary state.

The present invention is not limited to the first and second embodiments, and the embodiments are modified as follows.

(a) In the first and second embodiments, the differential input part 10 having a pair of PMOS transistor, to which the differential input signals are supplied, is described as the input part according to the present invention. The differential input part 10 is modified into a differential input part having a pair of NMOS transistor and a rail-to-rail differential input part capable of inputting input signals at wide range levels.

(b) In the first and second embodiments, the differential input part 10 generates the output signal in response to two input signals. The differential input part 10 can be modified into another input part, for example, a simple input part generating an output signal in response to single input signal.

This application is based on Japanese Patent Application No. 2006-171625 which is herein incorporated by reference.

What is claimed is:

1. A display panel driving circuit comprising;
    an input part for amplifying an input on-off signal so as to generate a first on-off voltage signal;
    a voltage signal generation part for generating a second on-off voltage signal whose voltage is varied in response to variations in voltage of said first on-off voltage signal; and
    an output part including a first output transistor having a first conductive type and a second output transistor having a second conductive type, said first output transistor and said second output transistor being push-pull connected for generating a push-pull output voltage as a driving voltage so as to drive a display panel, conductivities of said first output transistor and said second output transistor being controlled by said first on-off voltage signal and said second on-off voltage signal, respectively,
    wherein
    said display panel driving circuit further comprises a controlling part for controlling said voltage signal generation part so that a difference between on and off voltages of said second on-off voltage signal is not smaller than a predetermined voltage.

2. A display panel driving circuit according to claim 1, wherein
    said voltage signal generation part includes a mirror circuit having a pair of mirror transistors, a current source for respectively supplying electric currents to said pair of mirror transistors, and an input transistor connected in parallel to one of said pair of mirror transistors, said input transistor having an on-off state controlled by said first on-off voltage signal, and
    said controlling part includes an electric current supplying circuit for increasing an electric current supply to said one of said pair of mirror transistors in response to said second on-off voltage signal whose voltage is lower than a predetermined voltage.

3. A display panel driving circuit according to claim 2, wherein said electric current supplying circuit includes a transistor for supplying an electric current to said one of said pair of mirror transistors, a current source for supplying an electric current to said transistor, and a diode-connected transistor connected across said transistor and said current source thereof.

4. A display panel driving circuit according to claim 1, wherein said voltage signal generation part includes a mirror circuit having a pair of mirror transistors, a current source for respectively supplying electric currents to said pair of mirror transistors, and an input transistor connected in parallel to one of said pair of mirror transistors, said input transistor having an on-off state controlled by said first on-off voltage signal, and said controlling part includes an electric current receiving circuit for increasing an electric current receive from said one of said pair of mirror transistors in response to said second on-off voltage signal whose voltage is higher than a predetermined voltage.

5. A display panel driving circuit according to claim 4, wherein said electric current receiving circuit includes a transistor for receiving an electric current from said one of said pair of mirror transistors, a current source for receiving an electric current from said transistor, and a diode-connected transistor connected across said transistor and said current source thereof.

* * * * *